United States Patent
Chen

(10) Patent No.: US 10,068,623 B2
(45) Date of Patent: *Sep. 4, 2018

(54) APPARATUSES AND METHODS FOR COMPENSATING FOR PROCESS, VOLTAGE, AND TEMPERATURE VARIATION IN A MEMORY

(71) Applicant: MICRON TECHNOLOGY, INC., Boise, ID (US)

(72) Inventor: Jiawei Chen, Shanghai (CN)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/627,242

(22) Filed: Jun. 19, 2017

(65) Prior Publication Data

US 2017/0287529 A1 Oct. 5, 2017

Related U.S. Application Data

(63) Continuation of application No. 14/420,642, filed as application No. PCT/CN2014/091329 on Nov. 17, 2014, now Pat. No. 9,691,443.

(51) Int. Cl.
  *G11C 16/26* (2006.01)
  *G11C 7/14* (2006.01)
  (Continued)

(52) U.S. Cl.
  CPC ............... *G11C 7/04* (2013.01); *G11C 5/147* (2013.01); *G11C 7/1057* (2013.01);
  (Continued)

(58) Field of Classification Search
  CPC ......... G11C 7/04; G11C 5/147; G11C 7/1057; G11C 7/14; G11C 16/26; G11C 16/28; H03K 19/018521
  (Continued)

(56) References Cited

U.S. PATENT DOCUMENTS 4,893,032 A 1/1990 Braden
5,428,303 A 6/1995 Pasqualini
(Continued)

FOREIGN PATENT DOCUMENTS

CN 203859521 U 10/2014

OTHER PUBLICATIONS

International Search Report & Written Opinion dated Aug. 20, 2015 received for PCT/CN2014/091329.

*Primary Examiner* — Ly D Pham
(74) *Attorney, Agent, or Firm* — Dorsey & Whitney LLP

(57) ABSTRACT

Systems and methods are described for compensating for variations in process, voltage, temperature, or combinations thereof in an apparatus. An example apparatus may be a memory circuit. A pre-driver circuit and driver circuit may be associated with the memory circuit. A reference generator may provide the pre-driver circuit with reference signals that are insensitive to process, voltage, and temperature. The pre-driver circuit may receive the reference signals and the pre-driver circuit output ramping rate may then be made less sensitive to variations in process, voltage, and temperature. The pre-driver circuit output may then be supplied to a driver circuit that may then output a final driver data output with reduced noise.

20 Claims, 5 Drawing Sheets

(51) Int. Cl.
*G11C 7/04* (2006.01)
*G11C 7/10* (2006.01)
*G11C 5/14* (2006.01)
*H03K 19/0185* (2006.01)
*G11C 16/28* (2006.01)

(52) U.S. Cl.
CPC ....... *H03K 19/018521* (2013.01); *G11C 7/14* (2013.01); *G11C 16/26* (2013.01); *G11C 16/28* (2013.01)

(58) Field of Classification Search
USPC .................................................. 365/185.02
See application file for complete search history.

(56) References Cited

U.S. PATENT DOCUMENTS

| | | | |
|---|---|---|---|
| 6,040,708 A * | 3/2000 | Blake | H03K 3/356113 326/33 |
| 6,069,521 A | 5/2000 | Taylor et al. | |
| 6,198,325 B1 | 3/2001 | Ang et al. | |
| 6,949,949 B2 | 9/2005 | Lundberg | |
| 7,791,367 B1 * | 9/2010 | Pelley | H03K 19/018585 326/30 |
| 9,013,212 B2 * | 4/2015 | Kumar | G11C 7/1057 327/108 |
| 2010/0302880 A1 | 12/2010 | Wang et al. | |
| 2011/0254591 A1 * | 10/2011 | Monga | H03K 19/018528 326/80 |

* cited by examiner

APPARATUSES AND METHODS FOR COMPENSATING FOR PROCESS, VOLTAGE, AND TEMPERATURE VARIATION IN A MEMORY

CROSS-REFERENCE TO RELATED APPLICATIONS

This application is a continuation of U.S. patent application No. 14/420,642 (the '642 Application), filed Feb. 9, 2015, issued as U.S. Pat. No. 9,691,443 (the '443 Patent) on Jun. 27, 2017, which is a 371 National Stage application claiming priority to International Application No. PCT/CN2014/091329 (the PCT Application), filed Nov. 17, 2014. The '642 Application, the PCT Application and the '443 Patent are incorporated by reference herein in their entireties and for all purposes.

BACKGROUND OF THE INVENTION

Memories may be provided in a variety of apparatuses, such as computers or other devices, including but not limited to portable memory devices, solid state drives, music players, cameras, phones, wireless devices, displays, chip sets, set top boxes, gaming systems, vehicles, and appliances. There are many different types of memory including volatile memory (e.g., dynamic random access memory (DRAM)) and non-volatile memory (e.g., flash memory). Flash memory architectures may include NAND or NOR architecture.

Memory performance can be improved by compensating for variations in process, voltage, and temperature of the memory that may affect pre-driver circuit and driver circuit performance. Process variations are naturally occurring variations in the attributes of transistors that occur when integrated circuits are fabricated. Voltage variations may affect the final voltage and current output of the driver circuit. Temperature variations may affect the threshold voltages of transistors in the pre-driver circuit and driver circuit. Compensation for the effects of these variations can achieved by adjusting the ramping rate of a pre-driver circuit that supplies signals to a driver circuit. The pre-driver circuit may be configured to provide both a fast ramping raw corresponding to a higher output stage logic power voltage $V_{CCQ}$, and a slower ramping rate corresponding to a lower $V_{CCQ}$. The speed of the ramping rate in the pre-driver circuit that is provided with the higher $V_{CCQ}$ also generates higher noise in the final output of the driver circuit. Often it is not necessary to have this higher speed ramping rate, as the slower ramping speed is sufficiently fast. The pre-driver fast ramping rate corresponding to a higher data voltage out may be slowed down to more closely match the pre-driver slow ramping rate corresponding to a lower data voltage out. Because the ramping rates are more closely matched, the resultant current output from the pre-driver circuit may have a reduced sensitivity to variations in process, voltage, and temperature that may be present in the memory, and therefore transmit less noise to the final driver circuit output.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
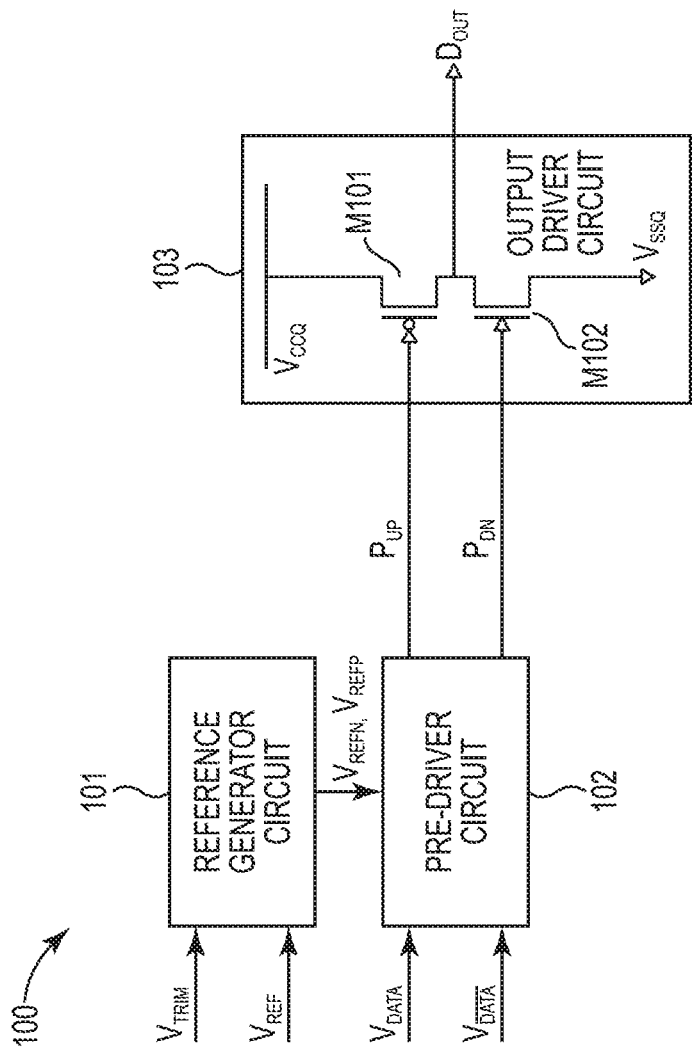
FIG. 1 is a block diagram of an apparatus including an output driver circuit, pre-driver circuit, and a reference generator circuit, according to an embodiment of the invention.

FIG. 1 illustrates an apparatus 100 according to an embodiment of the invention. As used herein, apparatus may refer to, for example, an integrated circuit, a memory device, a memory system, an electronic device or system, a smart phone, a tablet, a computer, a server, etc.

Apparatus 100 may also include, for example, a reference generator circuit 101, a pre-driver circuit 102, and an output driver circuit 103. The output driver circuit 103 includes an output driver transistor M101, and an output driver transistor M102. In the embodiment illustrated in FIG. 1, the output driver transistor M101 is shown as a p-channel transistor and the output driver transistor M102 is shown as an n-channel transistor. Other types of transistors may be used in other embodiments, however. The reference generator circuit 101 may be configured to receive a trim signal $V_{TRIM}$ and a reference voltage $V_{REF}$ to provide one or more reference signals to the pre-driver circuit 102. The reference signals provided to the pre driver circuit 102 may include a $V_{REFP}$ signal and a $V_{REFN}$ signal. The $V_{REFP}$ and $V_{REFN}$ signals may be based at least in part on the $V_{TRIM}$ and $V_{REF}$ signals provided to the reference generator circuit 101. Values for the $V_{TRIM}$ signal and the $V_{REF}$ voltage may be determined during the manufacture of the apparatus 100. The pre-driver circuit 102 may be configured to provide pre-driver pull-up signal $P_{UP}$ to the output driver transistor M101 and the pre-driver pull-down signal $P_{DN}$ to the output driver transistor M102 of the output driver circuit 103. As will be described in more detail below, the $V_{REFP}$ and $V_{REFN}$ signals provided by the reference generator circuit 101 may be used by the pre-driver circuit 102 to provide $P_{UP}$ and $P_{DN}$ signals having voltages and currents that may compensate tier temperature, process, and voltage sensitivities of the pre-driver circuit 102 and/or the output driver circuit 103.

In some embodiments, the output driver transistor M101 and the output driver transistor M102 may be arranged in an inverter, push-pull configuration and the output driver transistor M101 may receive pre-driver pull-up signal $P_{UP}$ and function as a pull-up transistor while the output driver transistor M102 receives pull-down signal $P_{DN}$ and function as a pull-down transistor in order to generate the driver output signal $D_{OUT}$. The source of the output driver transistor M101 may be coupled to a supply voltage, for example, $V_{CCQ}$, while the drain of the output driver transistor M102 may be coupled to a reference voltage, lot example, $V_{SSQ}$.

The pre-driver circuit may be configured to operate according to a "last ramping" rate or for a "slow ramping" rate. When configured to operate according to the fast ramping rate the rate at which output data changes between logic levels is relatively faster than the rate at which output data changes between logic levels when operating according to the slow ramping rate. In the case of the pre-driver circuit being configured for a fast ramping rate, a supply voltage $V_{CCQ}$ may be in the range of 2.7 to 3.6 volts. If the pre-driver circuit is configured for a slow ramping rate, the supply voltage $V_{CCQ}$ may be in the range of 1.7 to 2.0 volts. The output driver transistors M101 and M102 may be larger than the transistors in pre-driver circuit 102 and reference generator circuit 101, in order to provide greater current drive fir the final driver output signal $D_{OUT}$.

Figure 2:
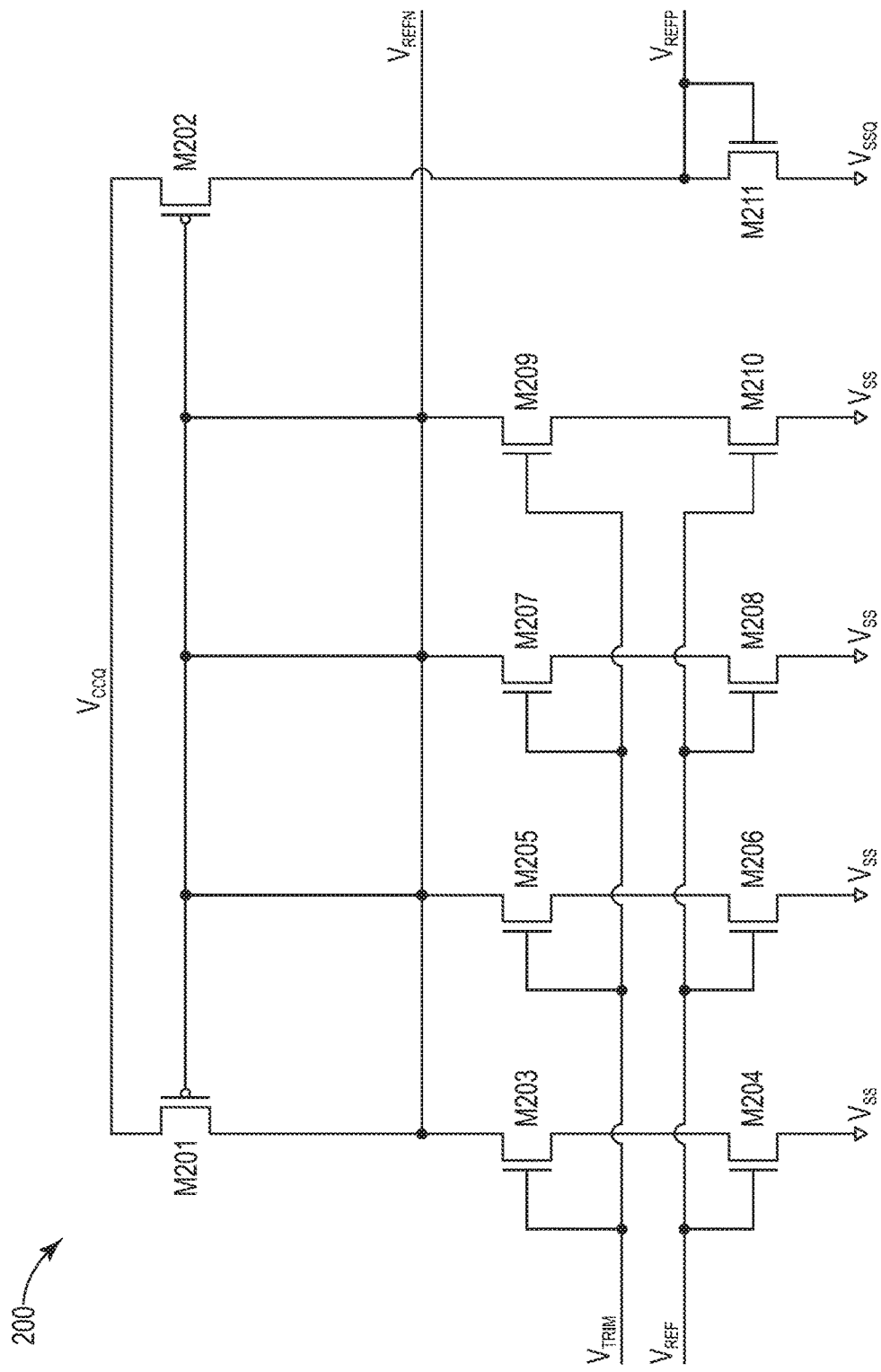
FIG. 2 is a schematic diagram illustrating a reference generator circuit, according to an embodiment of the invention.

FIG. 2 illustrates a schematic diagram of a reference generator circuit 200 according to an embodiment of the invention. The reference generator circuit 200 may be used, for example, as reference generator circuit 101 from FIG. 1. The reference generator circuit 200 includes transistors M201 and M202, and transistors M203, M204, M205, M206, M207, M208, M209, M210, and M211. The gates of transistors M203, M205, M207, and M209 may be configured to be responsive to signal $V_{TRIM}$. The gates of transistors M204, M206, M208, and M210 may be configured to be responsive to $V_{REF}$. In the embodiment illustrated in FIG. 2, the transistors M201 and M202 are illustrated as p-channel transistors, and the transistors M203-M211 are illustrated as n-channel transistors. Other types of transistors may be used in other embodiments, however.

The transistors M201 and M202 may be coupled at the source and body terminals to a supply voltage, for example, $V_{CCQ}$. The gate and drain terminals of the transistor M201 and the gate terminal of the transistor M202 may be coupled to the drain terminals of the transistors M203, M205, M207, and M209. The drain terminal al the transistor M202 may be coupled to the drain and gate terminal of the transistor M211. The drains of the transistors M204, M206, M208, and M210 are coupled to a reference voltage, for example, $V_{SS}$. The drain of the transistor M211 may also be coupled to reference voltage, for example, $V_{SSQ}$. The reference voltage $V_{SS}$ may represent an internal reference voltage, and the reference voltage $V_{SS}$ may represent a reference voltage suitable for an output data signal, for example, as provided by an output driver circuit. In some embodiments, the reference voltages $V_{SS}$ and $V_{SSQ}$ are the same. In some embodiments, however, the reference voltages $V_{SS}$ and $V_{SSQ}$ may be different.

In operation, the combination of the transistor M201, and the transistors M203, M204, M205, M206, M207, M208, M209, and M210 may provide various current paths from $V_{CCQ}$ to $V_{SS}$ based on the $V_{TRIM}$ and $V_{REF}$ signals. The $V_{TRIM}$ signal may be a trim signal that is set at a voltage to account for variations in circuit performance. The Vtrim signal may be determined during a test phase of the reference generator circuit 200, which may be performed as part of the manufacturing process. When the voltage of the $V_{TRIM}$ signal is determined, it may be programmed, for example, in fuses, antifuses, non-volatile memory cells, etc., so that the $V_{TRIM}$ signal may be provided at the proper voltage whenever the reference generator circuit 200 is operational. The $V_{REF}$ signal may be a reference voltage signal, and may be provided by an internal reference generator, for example, a band gap voltage reference generator (not shown). The transistor M211 may be configured as a current mirror with the transistors M201 and M202, and provide a $V_{REFP}$ signal. A $V_{REFN}$ signal may be provided at a drain of the transistor M201 (common with drains of the transistors M203, M205, M207, and M209).

The transistors M203, M205, M207, and M209 are configured to be responsive to signal $V_{TRIM}$. The transistors M203, M205, M207, and M209 may be wide-channel n-channel transistors, for example. The $V_{TRIM}$ signal may be a multi-bit signal where each bit corresponds to a respective one of the transistors M203, M205, M207, and M209, and may be used to control the conductivity of the respective transistor. Other $V_{TRIM}$ signal to transistor arrangements may be used as well, for example, the $V_{TRIM}$ signal may represent a code that enables particular combinations of the transistors M203, M205, M207, and M209. The bit configuration of the $VT_{TRIM}$ signal may allow the $V_{TRIM}$ signal to be selectively applied to the gates of the transistors M203, M205, M207, and M209, and may allow an increase in current flow from $V_{CCQ}$ to $V_{SS}$ through the current paths. This increase in current flow may in turn allow for an adjustment of the voltage of the $V_{REFN}$ or $V_{REFP}$ output signals that, for example, may be supplied to a pre-driver circuit, such as the pre-driver circuit 102 of FIG. 1.

The transistors M204, M206, M208, and M210 are configured to be responsive to the $V_{REF}$ signal. The $V_{REF}$ signal may be a reference signal configured to provide each of the transistors M204, M206, M208, and M210 with a reference voltage, for example of 1 volt. Other voltages may be provided as well. Compensation for variations in process, voltage, and temperature through adjustment of components and inputs to the reference generator circuit 200 will now be described. A balance of approaches to compensating for the effects of process, voltage, and temperature variation on the current supplied to the pre-driver circuit will yield a signal transition speed for the pre-driver circuit that may be generally consistent over variations in process, temperature, voltage, or combinations thereof, and may reduce noise of the output of the final driver circuit.

The reference generator 200 is configured to provide $V_{REFN}$ and $V_{REF}$ signals that may be insensitive to variations in operating condition and circuit processing. The $V_{TRIM}$ and $V_{REF}$ signals may be used to set a current through the current paths of the reference generator circuit 200, which in turn may result in the current and voltage output of the $V_{REFN}$ and $V_{REFP}$ signals to be insensitive as well. The $V_{REFN}$ and $V_{REFP}$ signals may be provided to an output driver circuit (e.g., the output driver circuit 103 of FIG. 1) to cause signal transitions of an output data signal between different logic levels to be generally consistent The resulting signal transitions of the output data may be generally consistent for different temperature, voltage, and process conditions. For example, where variations in voltage, temperature, process conditions, or combinations thereof result in $V_{REFN}$ and $V_{REFP}$ signals that would otherwise cause an output driver circuit (e.g., the output driver circuit 103 of FIG. 1) to provide output data having relatively fast signal transitions, the $V_{REFN}$ and $V_{REFP}$ signals provided by the reference generator circuit 200 result in the output driver circuit having relatively slower signal transitions. Conversely, where the output driver circuit would otherwise provide output data having relatively slow signal transitions, the $V_{REFN}$ and $V_{REFP}$ signals provided by the reference generator circuit 200 result in the output driver circuit having relatively faster signal transitions. The speed of the signal transitions for the different conditions may thus be relatively consistent.

Process Variation Compensation

Fabrication of transistors and components during integrated circuit may introduce naturally occurring variations in the attributes of components. This is referred to as process variation. For example, lengths, widths, and thicknesses of transistors may vary within a tolerance during manufacturing of an integrated circuit. Controlling an apparatus at a given voltage and temperature may allow the measurement of process variation effects, and may allow for the compensation of said process variation effects.

Providing $V_{REF}$ signal to the gates of the transistors M204, M206, M208, and M210 may allow a reference current to be set for the reference generator circuit. For a given measured apparatus temperature and supply voltage $V_{CCQ}$, multi-hit $V_{TRIM}$ may be provided to the gates of the transistors M203, M205, M207, and M209 in the reference generator circuit in order to achieve the desired current and voltage for $V_{REFP}$ and $V_{REFN}$, which may then be supplied to the pre-driver circuit to compensate any process variations effects in the apparatus.

Temperature Variation Compensation

Variations in temperature of an apparatus may affect the performance of transistors by creating variation in the threshold voltage, $V_{TH}$, required to activate the transistors. For example, transistors at a lower temperature will have a higher $V_{TH}$. Conversely, transistors of at a higher temperature will have a lower $V_{TH}$. A transistor's performance may be measured by the amount of current that passes through the transistor. This current measurement is a function of the difference between the gate-source voltage and $V_{TH}$. By changing the gate-source voltage, the temperature effects on $V_{TH}$ and the current passing through the transistors can be mitigated.

As such, $V_{REF}$ may be adjusted based on temperature change in order to compensate for temperature effects on current. Increasing $V_{REF}$ as the temperature increases will reduce circuit sensitivity to an increase in temperature by increasing the gate-source voltage of the transistors M204, M206, M208, and M210, and driving these transistors into saturation. At this, point these transistors begin to function with low resistance and allow current flow between $V_{CCQ}$ and $V_{SS}$. Conversely, a lower $V_{REF}$ applied at lower temperatures will result in a lower gate-some voltage on the transistors M204, M206, M208 and M210 and reduce current flow. Thus, adjusting $V_{REF}$ based on temperature changes may provide compensation inverse to the inherent relationship between transistor performance and temperature changes. In this way, temperature effects on transistors, for example, within a pre-driver circuit may be mitigated, and temperature sensitivity may be reduced.

Voltage Variation Compensation

The voltage supplied to the apparatus may be susceptible to variation. For example, supply voltage $V_{CCQ}$ may operate within several ranges, including from 2.7 to 3.6 volts or alternately from 1.7 to 2.0 volts. This variation in $V_{CCQ}$ can increase noise in the final driver circuit output. There may be several ways to compensate for the effects of this voltage variation by making adjustments in the reference generator circuit. For example, multi-bit signal $V_{TRIM}$ may be adjusted in order to drive the transistors M203, M205, M207, and M209 individually or in combination into saturation by applying a $V_{TRIM}$ voltage to the transistor gate that matches $V_{CCQ}$. This will allow the transistors M203, M205, M207, and M209 to function as a cascode circuit when $V_{CCQ}$ is high, and reduce the impact on the drain-source voltage on the transistors M204, M206, M208, and M210, thereby reducing the impact of variation in supply voltage $V_{CCQ}$ on the signals $V_{REFP}$ and $V_{REFN}$.

The impact of variation in the supply voltage $V_{CCQ}$ on the signals $V_{REFP}$ and $V_{REFN}$ may also be mitigated by using the long-channel transistors M204, M206, M208, and M210 having increased channel lengths. Increasing the channel length of the transistors may provide a greater effective resistance and increase the threshold voltage of the transistors. This may also reduce the impact on the drain-source voltage on these transistors and reduce the impact of variation in supply voltage $V_{CCQ}$ on the current of signals $V_{REFP}$ and $V_{REFN}$. The channel lengths of the transistors M204, M206, M208, and M210 may be, for example, be six times longer or more than the other transistors in the reference generator circuit 200.

Figure 3:
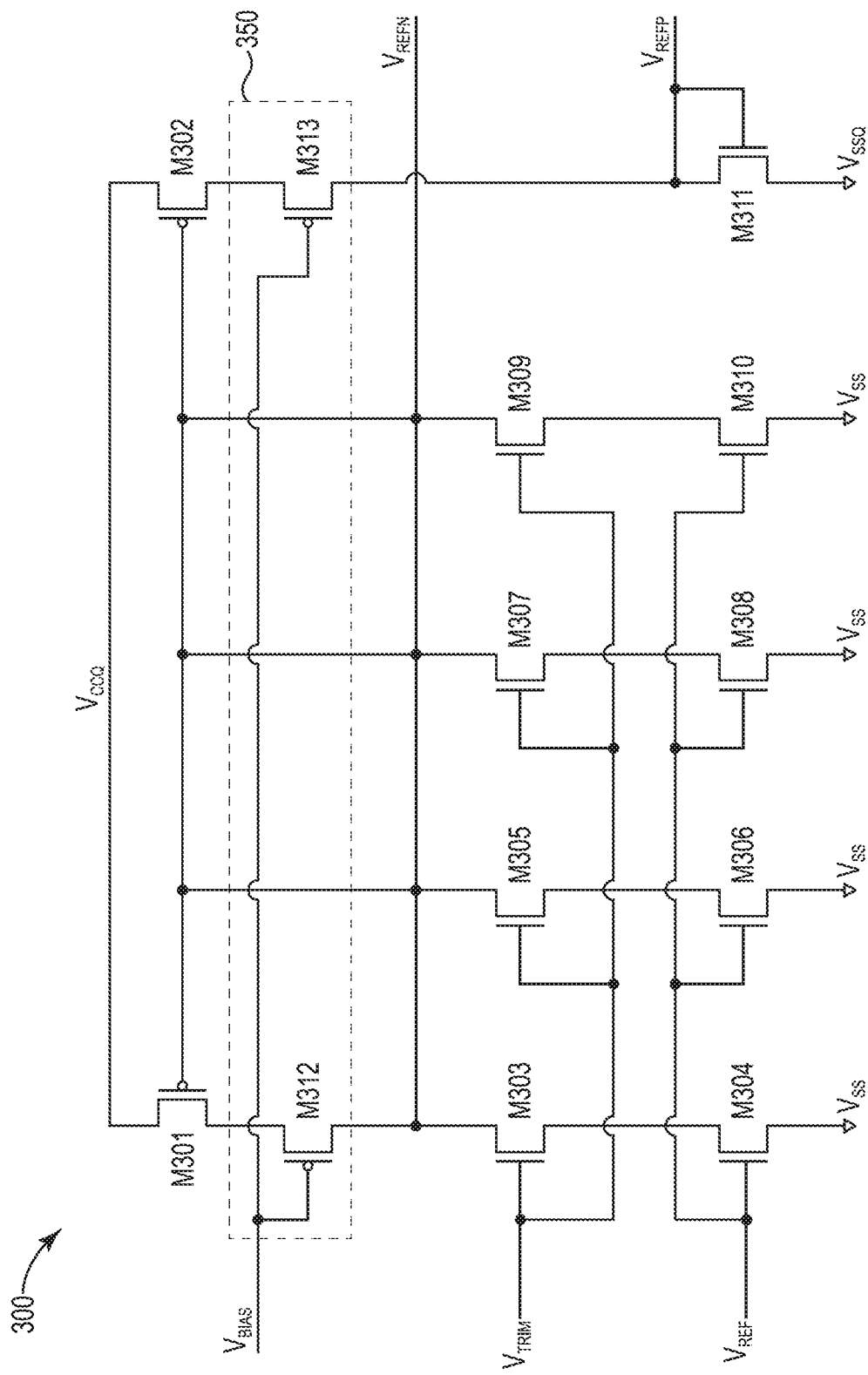
FIG. 3 is a schematic diagram illustrating a reference generator circuit including a bias generator circuit, according to an embodiment of the invention.

FIG. 3 illustrates a schematic diagram of a reference generator circuit 300 according to an embodiment of the invention. The reference generator circuit 300 may be used as the reference generator circuit 101 from FIG. 1. The reference generator circuit 300 may include a bias generator circuit 350. The bias generator circuit 350 may include the transistors M312 and M313. The reference generator circuit 300 may also include, for example, the transistors M301 and M302, and the transistors M303, M304, M305, M306, M307, M308, M309, M310, and M311. The gates of the transistors M303, M305, M307, and M309 may be configured to be responsive to signal $V_{TRIM}$. The gates of transistors M304, M306, M308, and M310 may be configured to be responsive to $V_{REF}$.

In operation, the reference generator circuit 300 may function in a manner similar to that described with respect to the reference generator circuit 200 from FIG. 2. The reference generator circuit 300 includes additional components in the form of the bias generator circuit'350, the operation of which will now be described.

The source of the transistor M312 may be connected to the drain of the transistor M301, while the source of the transistor M313 may be connected to the drain of the transistor M302. The drain terminal of the transistor M312 may be connected to the drain terminals of the transistors M303, M305, M307, and M309. The drain terminal of transistor M312 may also provide the $V_{REFN}$ signal. The drain terminal of the transistor M313 may be connected to the drain terminal of the transistor M311. The drain terminal of the transistor M313 may also provide the $V_{REFP}$ signal. The gate terminals of the transistors M312 and M313 may be configured to be responsive to bias signal, $V_{BIAS}$.

In operation, the transistors M312 and M313 may function as a cascode circuit that may reduce the impact of the supply voltage $V_{CCQ}$ on the drain-source voltage of the transistors M301 and M302. Thus applying the $V_{BIAS}$ signal to the gates of the transistors M312 and M313 may further compensate for effects from an variation in $V_{CCQ}$ voltage.

The compensation techniques describe above with respect to FIG. 2 and FIG. 3 may be combined to a desirable speed to noise ratio for the pre-driver circuit performance. In operation, the combination of compensation for process, voltage, and temperature variation may allow the pre-driver circuit to perform more consistently under a variety of circumstances.

Figure 4:
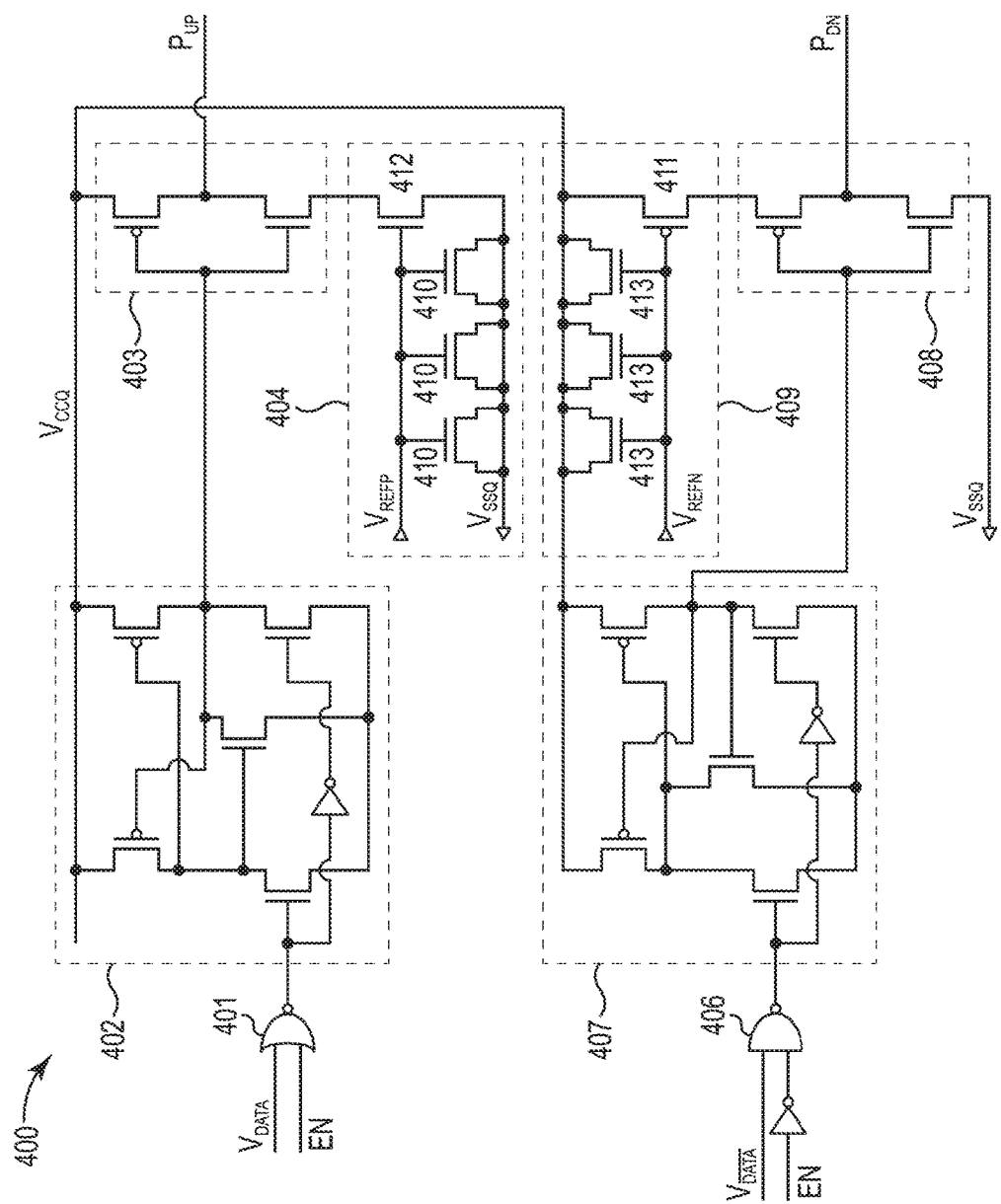
FIG. 4 is a schematic diagram of a pre-driver circuit, according to an embodiment of the invention.

FIG. 4 illustrates a schematic diagram of a pre-driver circuit 400 according to an embodiment of the invention. The pre-driver circuit 400 may be used as the pre-driver circuit 102 from FIG. 1. The pre-driver circuit 400 may include NOR logic circuit 401, NAND logic circuit 406, level shifter circuits 402 and 407, inverter circuits 403 and 408, and output control circuits 404 and 409. The pre-driver circuit 400 may be configured to provide signals $P_{UP}$ and $P_{DN}$ to a driver circuit, for example, such as driver circuit 103 from FIG. 1.

In operation, NOR logic circuit 401 receives a data signal $V_{DATA}$ and an enable signal EN. The EN signal may be provided by control logic (not shown) to enable the pre-driver circuit 400 to provide the $P_{UP}$ and $P_{DN}$ signals responsive to the $V_{DATA}$ signal. An output of NOR logic circuit 401 is provided to level shifter 402. The level shifter 402 is configured to change the voltage of an output provided in response to the $V_{DATA}$ signal to the inverter circuit 403. For example, the level shifter 402 may be configured to change the voltage of a high logic level to a voltage greater than that of the signal provided by the NOR logic circuit 401. The output of level shifter 402 is then provided to inverter 403. The inverter 403 provides pre-driver output signal $P_{UP}$, which may be supplied to a final driver circuit as a pull-up signal, for example, output driver circuit 103 from FIG. 1.

The inverter 403 is also connected to output control circuit 404, which controls the output of the signal $P_{UP}$. The output control circuit 404 is provided a $V_{REFP}$ signal. The $V_{REFP}$ signal may be provided, for example, by a reference voltage generator, such as reference voltage generator 200 or 300 of FIG. 2 and FIG. 3. The $V_{REFP}$ signal is provided to the transistor 412 of the output control circuit 404 to control the output of the $P_{UP}$ signal provided by the inverter 403, for example, controlling the voltage and/or current of the $P_{UP}$ signal. The transistors 410 of the output control circuit 404 are configured as capacitance circuits to aid in maintaining the voltage of the $V_{REFP}$ signal.

Similarly in operation, the NAND logic circuit 406 receives complementary data signal $V_{\overline{DATA}}$ and the EN signal. The $V_{\overline{DATA}}$ signal is complementary to the $V_{DATA}$ signal provided to the NOR logic circuit 401. An output of the NAND logic circuit 406 is provided to level shifter 407. The level shifter 407 is configured to change the voltage of an output of the level shifter, for example, change the voltage of a high logic level to a voltage greater than that of the signal provided by the NAND logic circuit 406. An output of level shifter 407 is provided to inverter 408. The inverter 408 provides pre-driver output signal $P_{DN}$, which may be supplied to a final driver circuit as a pull-down signal, for example, output driver circuit 103 from FIG. 1.

The inverter 408 is also connected to the output control circuit 409 which controls the output of the signal $P_{DN}$. The output control circuit 409 is provided a $V_{REFN}$ signal. The $V_{REFN}$ signal may be provided, for example, by a reference voltage generator, such as reference voltage generator 200 or 300 of FIG. 2 and FIG. 3. The $V_{REFN}$ signal is provided to a transistor 411 of the output control circuit 409 to control the output of the $P_{DN}$ signal provided by the inverter 408, for example, control the voltage and/or current of the $P_{DN}$ signal. The transistors 413 of the output control circuit 409 are configured as capacitance circuits to aid in maintaining the voltage of the $V_{REFN}$ signal.

As previously described, the $V_{REFP}$ and $V_{REFN}$ signals may be insensitive to temperature, voltage, and process variations. Providing such $V_{REFP}$ and $V_{REFN}$ signals to the pre-driver circuit 400 may result in $P_{UP}$ and $P_{DN}$ signals that can be used to control an output driver circuit to provide output data having signal transitions that are relatively consistent over various operating and process conditions. That is, where the operating and/or processing conditions would typically cause the speed of the signal transitions of the output data to be faster, the $P_{UP}$ and $P_{DN}$ signals provided by the pre-driver circuit 400 control the speed of the signal transitions to be relatively slower. Where the operating and/or processing conditions would typically cause the speed of the signal transitions of the output data to be slower, the $P_{UP}$ and $P_{DN}$ signals provided by the pre-driver circuit 400 control the speed of the signal transitions to be relatively faster. The result of the relatively slower and faster signal transitions are signal transitions between logic levels that may be more consistent over different operating and/or processing conditions.

Figure 5:
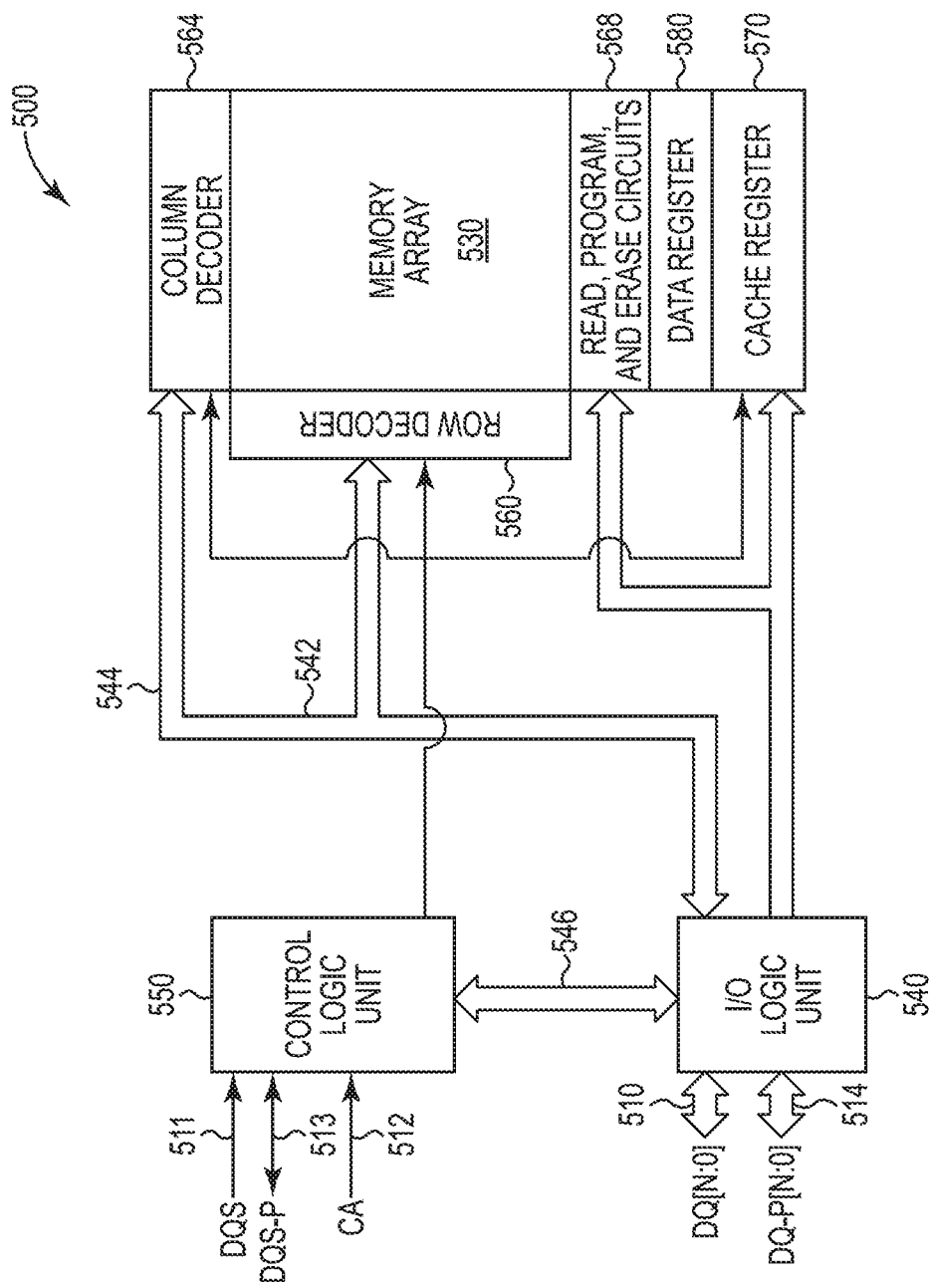
FIG. 5 is a block diagram of a memory, according to an embodiment of the invention.

FIG. 5 is a block diagram of a memory 500 according to embodiment of the present invention.

Data may be provided to and/or received from the memory 500 as respective to sets of sequential input/output ("I/O") signals transmitted over one or more of the busses 510, 514. The busses 510, 514 may/be connected to an I/O control unit 540 that routes data between the busses 510, 514 and/or other components of the memory 500. I/O control unit 540 may include reference generator 101, pre-driver circuit 102, and output driver circuit 103 from-apparatus 100, as described with respect to FIG. 1. The memory 500 also may include a control logic unit 550 that may receive a strobe signal DQS, a strobe signal DQS-P, and command and address signals CA over busses 511, 513, and 512, respectively. Each of the DQS, DQS-P, and CA signals may be used for operating the memory 500.

The memory 500 may include an array 530 of memory cells that may be lash memory cells, but may additionally or alternatively be DRAM, SDRAM, or any other type of memory cells. Moreover, the memory 500 may include an address bus 544 that applies block-row address signals to a row decoder 560 and column address signals to a column decoder 564. Block-row and column addresses may be based, at least in part, on the address of an address signal included in received CA signals. The row decoder 560 and column decoder 564 may be used to select blocks of memory or memory cells for memory operations, for example, read, program, and erase memory operations. The column decoder 564 may enable data to be applied to columns of memory corresponding to the column address signals and allows data to be coupled from columns of memory corresponding to the column address signals.

In response to the memory commands decoded by the control logic unit 550, the memory cells in the array 530 may be read, programmed, or erased. Read, program, and erase circuits 568 coupled to the memory array 530 may receive control signals from the control logic unit 550 and include voltage generators for generating various pumped voltages tar read, program and erase operations.

During a program operation, after the row address signals have been applied to the address bus 544, the I/O control unit 540 routes data to a cache register 570. The data are cached in the cache register 570 in successive sets each having a size corresponding to the width of the busses 510, 514. The cache register 570 sequentially stores the sets of data for an entire row or page of memory cells in the array 530. All of the stored data are then used to program a row or page of memory cells in the array 530 selected by the block-row address coupled through the address bus 544. In a similar manner, during a read operation, data signals from a row or block of memory cells selected by the block-row address coupled through the address bus 544 are stored in a data register 580. Sets of data corresponding in size to the width of the busses 510, 514 are then sequentially transferred through the I/O control unit 540 from the data register 580 to one or more of the busses 510, 514. The sets of data transferred through the I/O control unit 540 may pass through a pre-driver circuit and output driver circuit, such as those described with respect to FIGS. 1-4, in order to provide data sets that are insensitive to changes in process, voltage, and/or temperature.

From the foregoing it will be appreciated that, although specific embodiments of the invention have been described herein for purposes of illustration, various modifications may be made without deviating from the spirit and scope of the invention.

Accordingly, the invention is not limited to the specific embodiments of the invention described herein.

What is claimed is:

1. An apparatus comprising:
   a reference generator circuit configured to provide a first output signal and a second output signal, the reference generator circuit comprising:
      a first set of transistors; and
      a second set of transistors arranged in a cascode configuration with the first set of transistors;
   a pre-driver circuit configured to receive the first and second output signals and to provide a first pre-driver signal and a second pre-driver signal based on the first and second output signals; and
   an output driver circuit configured to receive the first and second pre-driver signals and to provide an output signal based on the first and second pre-driver signals.

2. The apparatus of claim 1, wherein the reference generator circuit further comprises a third set of transistors configured to receive a bias signal.

3. The apparatus of claim 2, further comprising a fourth set of transistors, wherein the third set of transistors is configured as a cascode circuit.

4. The apparatus of claim 1 wherein the transistors of the first and second sets of transistors comprise n-channel transistors.

5. An apparatus comprising:
   an output driver circuit configured to provide a data output signal;
   a pre-driver circuit configured to provide pre-driver signals to the output driver circuit; and
   a reference generator circuit configured to provide pre-driver reference signals to the pre-driver circuit, the reference generator circuit including first set of transistors and a second set of transistors, wherein the first set of transistors are in a cascode arrangement with the second set of transistors, and wherein a trim voltage signal is provided to the first set of transistors, wherein the trim voltage signal includes a plurality of signals and each signal of the plurality of signals is provided to a respective one of the first set of transistors.

6. The apparatus of claim 5 wherein the reference generator circuit further comprises a third set of transistors, a transistor of the third set of transistors configured to be coupled to a supply voltage and coupled to the first set of transistors.

7. The apparatus of claim 6 wherein the reference generator circuit further comprises a transistor coupled to another transistor of the third set of transistors and configured as a current mirror with the third set of transistors.

8. The apparatus of claim 7 wherein a first pre-driver reference signal is provided from the first set of transistors a second pre-driver reference signal is provided from the transistor configured as the current mirror.

9. The apparatus of claim 5 wherein each transistor of the first set of transistors is coupled in series with a respective one of the second set of transistors.

10. An apparatus comprising:
    an output driver circuit configured to provide a data output signal;
    a reference generator circuit configured to provide first and second pre-driver reference signals; and
    a pre-driver circuit coupled to a data signal line and a complement data signal line and configured to provide first and second pre-driver signals to the output driver circuit, the pre-driver circuit comprising:
       a first level shifter circuit configured to receive first data at the data signal line and provide a first level shifted output signal;
       a first pre-driver inverter circuit coupled to the first level shifter circuit and configured to provide the first pre-driver signal responsive to the first level shifted output signal;
       a second level shifter circuit configured to receive a complement of the first data at the complement data signal line and provide a second level shifted output signal; and
       a second pre-driver inverter circuit coupled to the second level shifter circuit and configured to provide the second pre-driver signal responsive to the second level shifted output signal.

11. The apparatus of claim 10 wherein the pre-driver circuit further comprises:
    a first output control circuit coupled to the first pre-driver inverter circuit and configured to receive the first pre-driver reference signal; and
    a second output control circuit coupled to the second pre-driver inverter circuit and configured to receive the second pre-driver reference signal.

12. The apparatus of claim 11 wherein the first output control circuit comprises a plurality capacitance circuits.

13. The apparatus of claim 10 wherein the output driver circuit comprises:
    a first output driver transistor configured to receive the first pre-driver signal; and
    a second output driver transistor configured to receive the second pre-driver signal.

14. An apparatus comprising:
    a reference generator circuit configured to provide a plurality of reference signals, the reference generator circuit includes first and second sets of transistors, wherein a trim voltage signal is provided to the first set of transistors and a reference voltage signal is provided to the second set of transistors, wherein the trim voltage signal includes a plurality of signals and each signal of the plurality of signals is provided to a respective one of the first set of transistors;
    a pre-driver circuit configured to provide a plurality of control signals responsive to receipt of the plurality of reference signals and a plurality of data signals; and
    an output driver circuit configured provide an output data signal responsive to receipt of the plurality of control signals.

15. The apparatus of claim 14 wherein the reference generator circuit further includes a third set of transistors having a transistor coupled to the first set of transistors and configured to receive a bias voltage signal.

16. The apparatus of claim 14 wherein the transistors of the second set of transistors comprise long-channel transistors.

17. The apparatus of claim 16 wherein channel lengths of the transistors of the second set of transistors are six times longer or more than the transistors of the first set of transistors.

18. The apparatus of claim 14 wherein the first set of transistors is configured to receive a supply voltage and wherein the plurality of signals of the trim voltage signal selectively drive the transistors of the first set of transistors into saturation.

19. The apparatus of claim 14, further comprising a bias generator circuit configured as a cascode circuit.

20. The apparatus of claim 14 wherein the transistors of the second set of transistors are configured to have a current flow adjusted by the reference voltage signal.

* * * * *